(12) United States Patent
Yamashita

(10) Patent No.: US 6,486,498 B2
(45) Date of Patent: Nov. 26, 2002

(54) SOLID-STATE IMAGING DEVICE

(75) Inventor: Hirofumi Yamashita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/956,044

(22) Filed: Sep. 20, 2001

(65) Prior Publication Data

US 2002/0036292 A1 Mar. 28, 2002

(30) Foreign Application Priority Data

Sep. 22, 2000 (JP) ........................................ 2000-288870

(51) Int. Cl.[7] .............................................. H01L 31/062
(52) U.S. Cl. ........................ 257/72; 257/215; 257/290; 257/291
(58) Field of Search ................................ 257/290, 291, 257/292, 233, 369, 232, 72, 215

(56) References Cited

U.S. PATENT DOCUMENTS

| | | |
|---|---|---|
| 5,625,210 A | 4/1997 | Lee et al. |
| 5,904,493 A | 5/1999 | Lee et al. |
| 6,027,955 A | 2/2000 | Lee et al. |
| 6,100,551 A | 8/2000 | Lee et al. |

*Primary Examiner*—Fetsum Abraham
(74) *Attorney, Agent, or Firm*—Oblon, Spivak, McClelland, Maier & Neustadt, P.C.

(57) ABSTRACT

A solid-state imaging device includes a semiconductor substrate including a surface region of a second conductivity type, and plural unit pixels arranged in a matrix form on the surface region of the second conductivity type. Each of the unit pixels includes a first semiconductor region of a first conductivity type separated by a preset distance from the surface of the surface region in the depth direction and accumulates signal charges obtained by photo-electrical conversion of input light, and a gate electrode formed above the surface region, adjacent to the first semiconductor region and controlling readout of the signal charge accumulated in the first semiconductor region, end portions of the gate electrode and the first semiconductor region separated by a preset distance in a horizontal direction. Thus, the signal charge can be easily read-out and occurrence of thermal noise at the dark time, dark current noise, image-lag can be suppressed.

10 Claims, 7 Drawing Sheets

SOLID-STATE IMAGING DEVICE

CROSS-REFERENCE TO RELATED APPLICATIONS

This application is based upon and claims the benefit of priority from the prior Japanese Patent Application No. 2000-288870, filed Sep. 22, 2000, the entire contents of which are incorporated herein by reference.

BACKGROUND OF THE INVENTION

1. Field of the Invention

This invention relates to a solid-state imaging device and more particularly to a solid-state imaging device such as a CMOS sensor formed by the CMOS technology.

2. Description of the Related Art

A solid-state imaging device has unit pixels arranged in a two-dimensional matrix form in an imaging area. FIG. 1 shows the cross sectional structure of one unit pixel of a conventional solid-state imaging device which is generally called a CMOS sensor.

A p-type well region (p-well) 32 is formed on a p-type silicon substrate 31. On the surface portion of the well region 32, a photo-electric conversion region 35 formed of a p$^+$-type diffused layer 33 and n-type diffused layer 34 is formed. The n-type diffused layer 34 constitutes a signal accumulation portion for accumulating signal charges obtained by photo-electrical conversion of input light and the p$^+$-type diffused layer 33 is formed to serve the purpose of preventing occurrence of a dark current.

A gate electrode 36 for controlling readout of the signal charge accumulated in the n-type diffused layer 34 constituting the signal accumulation portion is formed adjacent to the photo-electric conversion region 35. Further, an n-type diffused layer 37 used as a signal detection portion for detecting the signal charge transferred via a channel region lying below the gate electrode 36 is formed adjacent to the gate electrode 36. In addition, a gate electrode 38 for controlling transfer of the signal charge detected by the n-type diffused layer 37 is formed adjacent to the n-type diffused layer 37.

An amplifying MOS field effect transistor (the MOS field effect transistor is hereinafter referred to as a MOS transistor) 42 having a drain region 39 and source region 40 which are formed of n-type diffused layers and a gate electrode 41 is formed adjacent to the gate electrode 38. The gate electrode 41 of the amplifying MOS transistor 42 is connected to the n-type diffused layer 37 via an interconnection 43. A MOS transistor 45, which is a row select switch, is connected to the MOS transistor 42 in series. The source region 46 of the MOS transistor 45 is connected to a signal read-out line 44. In order to simplify the drawing, gate insulating films and interlayer dielectrics are omitted in the drawing.

Next, the operation of the unit pixel with the above cross sectional structure is explained.

During the signal accumulation period, a signal charge is generated according to input light incident on the photo-electric conversion region 35 and accumulated in the signal accumulation portion (n-type diffused layer 34). In the signal readout period after the end of the signal accumulation period, the readout gate electrode 36 is set into the ON state and the signal charge is discharged from the signal accumulation portion to the signal detection portion (n-type diffused layer 37) via the channel region lying below the gate electrode 36. In the signal detection portion, the signal charge is converted into signal voltage and the thus converted signal voltage is supplied to the gate electrode 41 of the amplifying MOS transistor 42 via the interconnection 43. The signal voltage is amplified by the MOS transistor 42 and read out from the readout line 44 connected to the source region 46 of the MOS transistor 45.

FIG. 2A is a cross sectional view showing the structure of an extracted portion including the signal accumulation portion (n-type diffused layer 34), signal detection portion (n-type diffused layer 37) and the surrounding portion of the unit pixel shown in FIG. 1 and FIG. 2B shows the state in which the signal charge is discharged from the signal accumulation portion (n-type diffused layer 34) to the signal detection portion (n-type diffused layer 37) and then the signal charge is read out in the signal readout period of the unit pixel shown in FIG. 2A by use of a potential diagram.

When the readout gate electrode 36 is set in the OFF state, a potential of the channel region below the gate electrode 36 becomes low and the signal charge accumulated in the signal accumulation portion (n-type diffused layer 34) is kept accumulated. If a readout potential for setting the gate electrode 36 into the ON state is supplied to the readout gate electrode 36, a potential of the channel region below the gate electrode 36 becomes high, the signal charge accumulated in the signal accumulation portion (n-type diffused layer 34) is discharged into the signal detection portion (n-type diffused layer 37) via the channel region and thus the signal charge is read out.

However, the conventional pixel has the following problems.

That is, when the readout operation is effected by discharging the signal charge into the signal detection portion, a potential of the channel region lying below the gate electrode 36 becomes high and a potential of a neighboring portion of the signal accumulation portion adjacent to the gate electrode 36 is accordingly modulated so that the signal charge can be read out from the signal accumulation portion.

However, since the p$^+$-type diffused layer 33 used for preventing occurrence of a dark current is formed, the potential of the neighboring portion of the signal accumulation portion which lies near the readout gate electrode 36 becomes difficult to be modulated according to the gate potential of the gate electrode 36. Therefore, as shown in FIG. 2B, a potential barrier which acts as an obstacle when the signal charge is discharged is formed under the edge portion of the readout gate electrode 36. As a result, part of the signal charge is left behind as the residual charge in the signal accumulation portion and the signal readout operation cannot be perfectly effected.

If the signal readout operation from the signal accumulation portion cannot be perfectly effected, a problem that the dynamic range of the imaging device is lowered and a problem that thermal noise of a dark potion increases and an image-lag occurs on the reproduced screen, and therefore, the quality of the reproduced image is extremely degraded. In addition, the above problems appear more significantly as the pixel size is further reduced.

According to the request for enhancing the quality of a reproduced image and reducing the element size, the size of the unit pixel tends to be reduced year by year. As the size of the unit pixel is reduced, the size of the MOS transistor is reduced accordingly, but a reduction in the element size is generally accompanied by a lowering in the application voltage and a rise in the impurity concentration of the well region according to the scaling-down rule.

However, if the scaling-down process is thus effected, a region which can be subjected to the potential modulation by the gate electrode is limited only to a portion near the gate electrode and is thus made narrower. Therefore, the potential modulation in a portion lying near the gate electrode 36 and neighboring to the signal accumulation portion (n-type diffused layer 34) which is formed in position deeper than the $p^+$-type diffused layer 33 formed on the surface becomes difficult to occur. As a result, the above-described potential barrier tends to occur more likely in the miniaturized pixel and the above problem inherent to the CMOS sensor becomes more significant.

Further, the following problem occurs in the conventional case. That is, as described above, it is preferable to form the $p^+$-type diffused layer 33 on the surface in the shallowest possible portion so that the potential modulation in a portion near the gate electrode 36 of the signal accumulation portion (n-type diffused layer 34) can be easily attained. However, if the $p^+$-type diffused layer 33 is form in the shallow position, the dark current occurring in the substrate surface tends to increase, and as a result, noise occurs on the reproduction screen.

As described above, in the conventional solid-state imaging device, the readout potential applied to the signal charge readout gate electrode is lowered as the unit pixel is miniaturized and if the impurity concentration of the well region which is formed below the gate electrode and in which the channel region is formed is increased, there occurs a problem that the operation for reading the signal charge from the signal accumulation portion cannot be effected to a sufficient degree and thermal noise at the dark time, dark current noise, image-lag and the like will occur.

Therefore, it is required to realize a solid-state imaging device which can permit the operation for reading the signal charge from the signal accumulation portion to be easily effected and prevent thermal noise, dark current noise, image-lag and the like from occurring even when the readout potential applied to the readout gate electrode is lowered as the unit pixel is miniaturized and if the impurity concentration of the well region which is formed below the gate electrode and in which the channel region is formed is increased.

BRIEF SUMMARY OF THE INVENTION

A solid-state imaging device according to a first aspect of this invention comprises a semiconductor substrate including a surface region of a second conductivity type; and a plurality of unit pixels arranged in a matrix form on the surface region of the second conductivity type, the plurality of unit pixels forming an imaging area and each of the plurality of unit pixels including a first semiconductor region of a first conductivity type which is formed in a position separated by a preset distance from a surface of the surface region in a depth direction of the surface region and accumulates signal charges obtained by photo-electrical conversion of input light, and a gate electrode which is formed adjacent to the first semiconductor region above the surface region and controls readout of the signal charges accumulated in the first semiconductor region, end portions of the gate electrode and the first semiconductor region which substantially face each other being formed in positions separated by a preset distance in a horizontal direction.

A solid-state imaging device according to a second aspect of this invention comprises a semiconductor substrate including a surface region of a second conductivity type; and a plurality of unit pixels arranged in a matrix form on the surface region of the second conductivity type, the plurality of unit pixels forming an imaging area and each of the plurality of unit pixels including a first semiconductor region of a first conductivity type which is formed in a position separated by a preset distance from a surface of the surface region in the depth direction of the surface region and accumulates signal charges obtained by photo-electrical conversion of input light, a gate electrode which is formed adjacent to the first semiconductor region above the surface region and controls readout of the signal charges accumulated in the first semiconductor region, end portions of the gate electrode and the first semiconductor region which substantially face each other being formed in positions separated by a preset distance in a horizontal direction, and a second semiconductor region of the first conductivity type which is formed in a channel region lying on an upper surface of the surface region and below the gate electrode and controls a threshold voltage of the gate electrode, the second semiconductor region being formed in a position separated from the first semiconductor region with the surface region disposed between the first and the second semiconductor region.

A solid-state imaging device according to a third aspect of this invention comprises a semiconductor substrate including a surface region of a second conductivity type; and a plurality of unit pixels arranged in a matrix form on the surface region, the plurality of unit pixels forming an imaging area and each of the plurality of unit pixels including a first semiconductor region of a first conductivity type which is formed in a position separated by a preset distance from a surface of the surface region in a depth direction of the surface region and accumulates signal charges obtained by photo-electrical conversion of input light, a gate electrode which is formed adjacent to the first semiconductor region above the surface region and controls readout of the signal charges accumulated in the first semiconductor region, and a fourth semiconductor region of the first conductivity type which is formed adjacent to the gate electrode and detects the signal charges read out by the gate electrode and transferred via a channel region below the gate electrode; wherein a potential of the channel region below the gate electrode is set to the same potential as that of the first semiconductor region when a readout potential is supplied to the gate electrode to set the gate electrode into an ON state and the potential of the channel region is set lower than that of the fourth semiconductor region when the gate electrode is set in an OFF state.

DETAILED DESCRIPTION OF THE INVENTION

There will now be described embodiments of this invention with reference to the accompanying drawings.

(First Embodiment)

Figure 1:
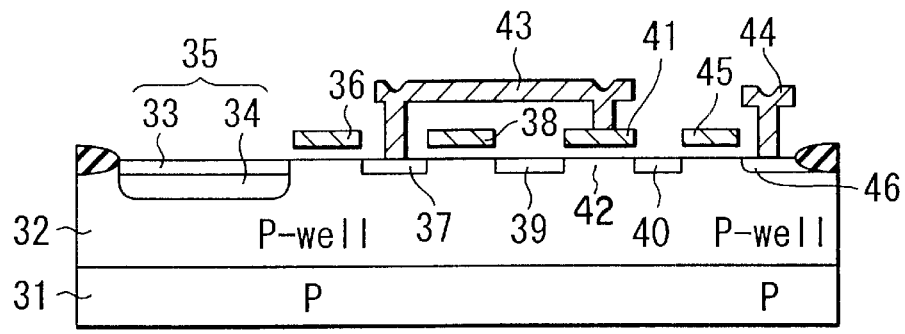
FIG. 1 is a cross sectional view showing the structure of a unit pixel of the conventional CMOS sensor.
Figure 2A:
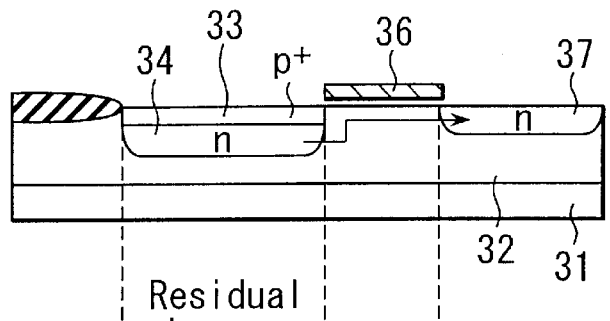
FIG. 2A is a cross sectional view showing the structure of an extracted portion including a signal accumulation portion and signal detection portion in the conventional unit pixel shown in FIG. 1.
Figure 2B:
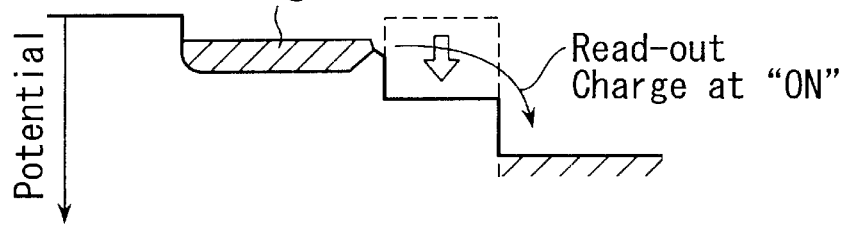
FIG. 2B is a schematic diagram showing the state in which the signal charge is read out in FIG. 2A based on the energy level.
Figure 3:
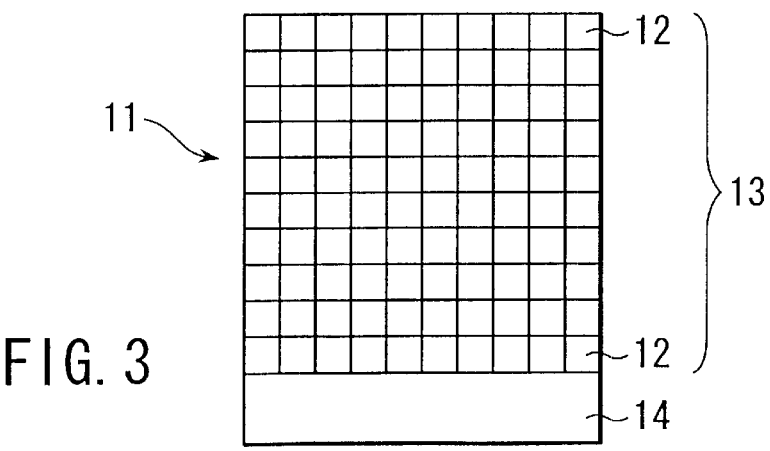
FIG. 3 is a diagram showing the whole structure (layout) of a CMOS sensor according to each of embodiments of the present invention.

FIG. 3 is a block diagram showing the entire structure of a CMOS sensor according to a first embodiment of the present invention. A CMOS sensor 11 is formed on a semiconductor substrate (not shown) and an imaging area 13 formed by arranging a plurality of unit pixels 12 in a two-dimensional matrix form and a scanning area 14 which reads out a signal from each of the unit pixels 12 of the imaging area 13 are integrated on the substrate.

Figure 4:
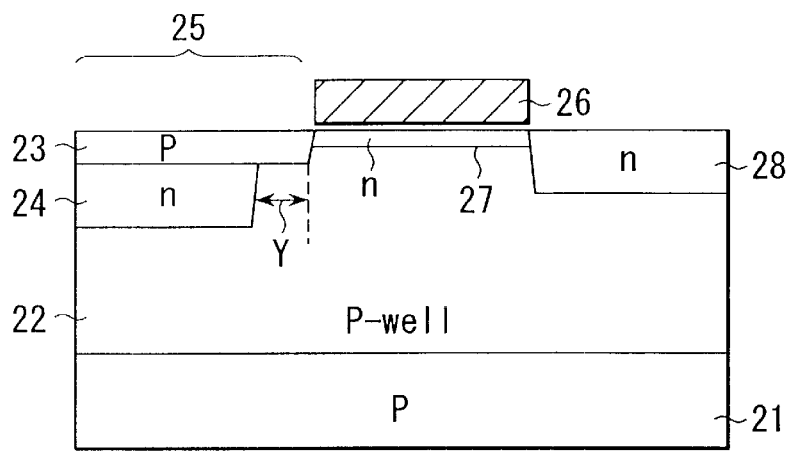
FIG. 4 is a cross sectional view showing a photo-electric conversion region, readout gate electrode and signal detection portion in a unit pixel of a CMOS sensor according to a first embodiment.

FIG. 4 is a cross sectional view showing an extracted portion including a photo-electric conversion region 25 in the unit pixel 12 of the CMOS sensor according to the first embodiment, a readout gate electrode 26 formed adjacent to the photo-electric conversion region 25 and a signal detection portion 28 which is formed adjacent to the gate electrode 26.

More specifically, a p-type well region (p-well) 22 is formed on a p-type silicon substrate 21. On the surface portion of the well region 22, the photo-electric conversion region 25 formed of a p$^+$-type diffused layer 23 and an n-type diffused layer 24 is formed. The n-type layer 24 constitutes a signal accumulation portion for accumulating signal charges obtained by photo-electrical conversion of input light and the p$^+$-type diffused layer 23 is formed to serve the purpose of preventing occurrence of a dark current.

The gate electrode 26 for controlling readout of the signal charge accumulated in the signal accumulation portion (n-type diffused layer 24) is formed adjacent to the photo-electric conversion region 25 above the surface of the well region 22. Further, an n-type diffused layer 27 used for controlling the threshold voltage of the gate electrode 26 is formed over the entire area in the channel region which lies on the surface portion of the well region 22 and below the gate electrode 26.

In addition, an n-type diffused layer 28 used as a signal detection portion for detecting the signal charge transferred via the channel region lying below the gate electrode 26 is formed adjacent to the gate electrode 26 on the surface portion of the well region 22. The n-type diffused layer 28 constitutes a drain of the readout MOS transistor having the gate electrode 26 and the signal accumulation portion (n-type diffused layer 24) constitutes a source thereof.

Further, in the photo-electric conversion region 25, the n-type diffused layer 24 constituting the signal accumulation portion is formed in a position separated in the horizontal direction from the end portion of the gate electrode 26 by a distance Y in the drawing. The distance Y is set at 50 to 300 nm, for example. In this case, the gate length is approximately 300 to 700 nm.

If, for example, the maximum value of the impurity concentration in the p$^+$-type diffused layer 23 is set in the range of $1 \times 10^{18}$ cm$^{-2}$ to $1 \times 10^{19}$ cm$^{-2}$, the maximum value of the impurity concentration in the n-type diffused layer 24 is set in the range of approximately $1 \times 10^{16}$ cm$^{-2}$ to $1 \times 10^{17}$ cm$^{-2}$ and the depth of the junction plane between the p$^+$-type diffused layer 23 and the n-type diffused layer 24 from the substrate surface is approximately 100 to 600 nm. Further, the impurity concentration in the n-type diffused layer 27 is approximately $1 \times 10^{16}$ cm$^{-2}$ to $1 \times 10^{17}$ cm$^{-2}$ and the junction depth is approximately 100 to 500 nm. Under the above condition, the distance Y is set to approximately 50 to 300 nm. As a matter of course, the impurity concentration of the p$^+$-type diffused layer 23 is higher than that of the p-type well region (p-well) 22.

Figure 5A:
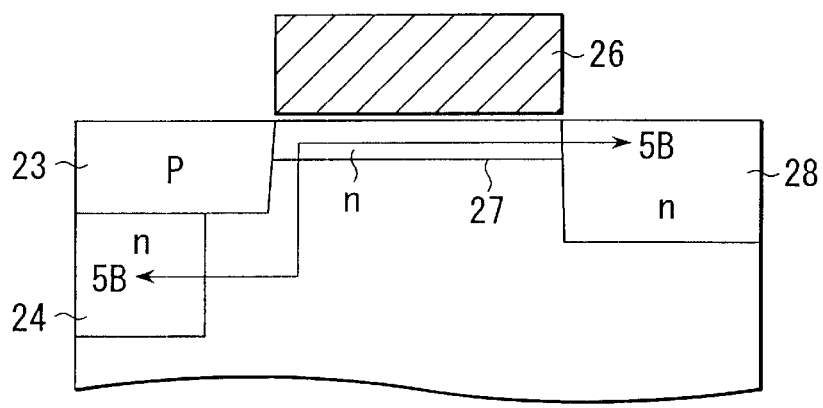
FIG. 5A is a cross sectional view showing an extracted and enlarged portion including the readout gate electrode 26 in the unit pixel of FIG. 4.
Figure 5B:
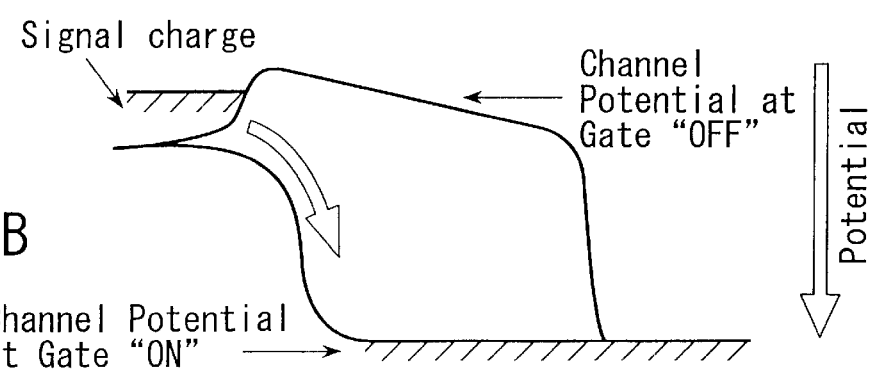
FIG. 5B is a diagram showing the potential profile of FIG. 5A.

FIG. 5A shows a cross sectional view showing an extracted enlarged portion including the readout gate electrode 26 in the unit pixel shown in FIG. 4 and FIG. 5B is a diagram showing a potential profile in a cross section taken along the line 5B—5B in FIG. 5A.

Since the channel potential of the channel region lying below the gate electrode 26 becomes higher than the potential of the signal detection portion (n-type diffused layer 28) in a case where a readout potential is applied to the gate electrode 26 and the gate electrode 26 is set in the ON state, a sufficiently large number of electrons flow from the signal detection portion, and as a result, the channel potential becomes equal to the potential of the signal detection portion (n-type diffused layer 28) so that the device can be turned ON by a gate voltage which is lower than the conventional case.

Further, when the readout potential is supplied, a depletion layer is formed below the gate electrode 26 and the depletion layer reaches a portion of the signal accumulation portion (n-type diffused layer 24) which lies near the gate electrode 26. Therefore, the potential barrier of the signal accumulation portion near the gate electrode 26 tends to be modulated and the signal charge (in this case, holes) accumulated in the signal accumulation portion (n-type diffused layer 24) flows out towards the channel region whose potential is high and thus the signal readout operation is effected.

In this case, the reason why the depletion layer reaches a portion of the signal accumulation portion (n-type diffused layer 24) even if the signal accumulation portion (n-type diffused layer 24) is formed separately from the gate electrode 26 is that the n-type diffused layer 27 for controlling the threshold voltage is formed in the channel region. That is, this is because a channel potential higher than the conventional case can be attained when the readout potential which is the same as that of the conventional case is supplied to the gate electrode 26.

In a case where a potential which sets the device into the OFF state is supplied to the gate electrode 26, the channel potential of the channel region lying below the gate electrode 26 becomes lower than the potential of the signal accumulation portion (n-type diffused layer 24). Therefore, in the OFF state the signal charge accumulated in the signal accumulation portion (n-type diffused layer 24) will not leak out of the signal accumulation portion.

Thus, in the CMOS sensor of the above embodiment, since the n-type diffused layer 27 is formed in the channel region below the gate electrode 26, a channel potential higher than the conventional case can be attained when the readout potential which is the same as that of the conventional case is supplied to the gate electrode 26. As a result, it is possible to prevent occurrence of the potential barrier which acts as an obstacle when the signal charge is discharged in a portion of the signal accumulation portion (n-type diffused layer 24) which lies near the gate electrode 26. Therefore, in the signal readout period, a part of the signal charges will not be left behind as a residual charge in the signal accumulation portion and the signal readout operation can be perfectly effected.

Further, in the above embodiment, the n-type diffused layer 27 is formed in the channel region and even if the signal accumulation portion (n-type diffused layer 24) is formed separated from the gate electrode 26, a depletion layer formed below the gate electrode 26 will reach a portion of the signal accumulation portion (n-type diffused layer 24) which lies near the gate electrode 26 when the readout potential is supplied to the gate electrode 26.

Thus, if the signal accumulation portion (n-type diffused layer 24) is formed separated from the gate electrode 26, no restriction is imposed on ion-implantation energy used when the signal accumulation portion (n-type diffused layer 24) is formed by ion-implantation. That is, since the signal accumulation portion (n-type diffused layer 24) is formed in a position separated by a preset distance Y in the horizontal direction from the end portion of the gate electrode 26 of an adjacent MOS transistor even if ion-implantation is effected by use of high energy, there is no possibility that ions penetrate through the gate electrode 26 and are implanted into the channel region. Therefore, the signal accumulation portion can be formed in a position deeper than the conventional case, consequently, the p$^+$-type diffused layer 23 formed on the substrate surface in the photo-electric conversion region can be made thick in the depth direction, and a dark current occurring in the photo-electric conversion region 25 can be suppressed.

Further, in a case where a readout potential supplied to the readout gate electrode is lowered with the miniaturization of the unit pixel and the impurity concentration of the well region in which the channel region is formed and which lies below the gate electrode, the signal charge can be easily read out from the signal accumulation portion and none of thermal noise at the dark time, dark current noise and image-lag occurs.

Figure 6:
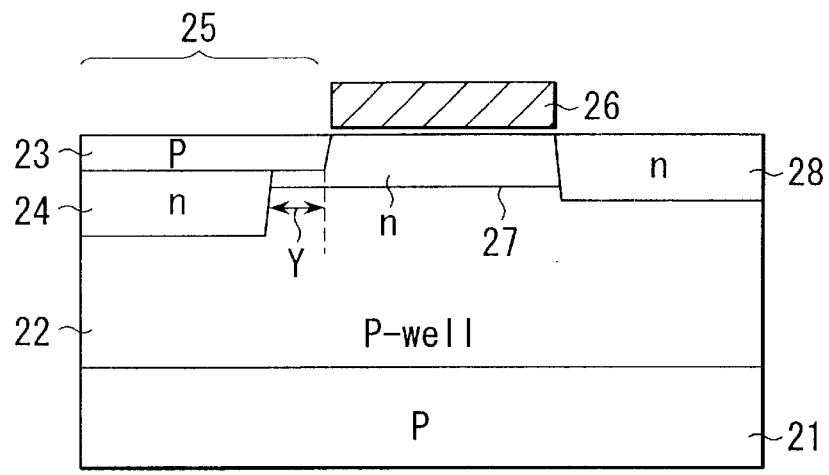
FIG. 6 is a cross sectional view showing a modification of the first embodiment.

In FIG. 4, the n-type diffused layer 27 is formed only below the gate electrode, but it is possible to form the n-type diffused layer 27 deeper and form the same under the p-type diffused layer 23 so as to make the diffused layer 27 in contact with the n-type diffused layer 24 as shown in FIG. 6.

Figure 7:
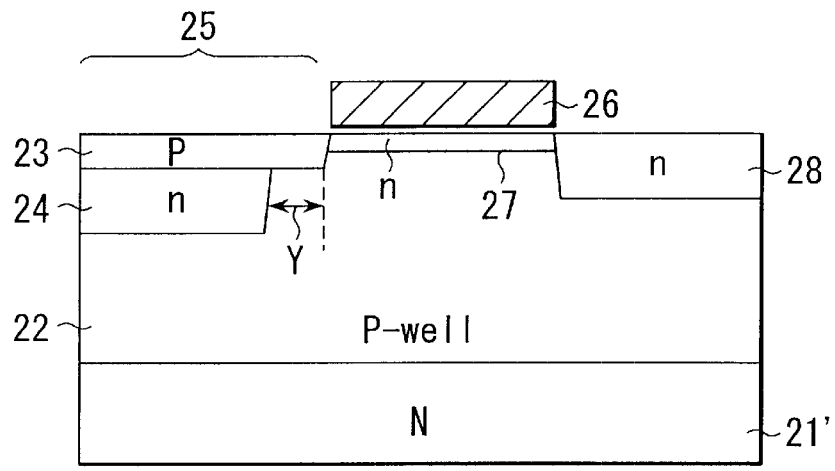
FIG. 7 is a cross sectional view showing another modification of the first embodiment.

Further, in FIGS. 4 and 6, the semiconductor substrate is formed as a p-type substrate, but an n-type semiconductor substrate can be used as shown in FIG. 7. When the n-type substrate is used, an advantage that photo-electrons generated in the deep portion of the substrate will not be introduced into the signal accumulation portion of the adjacent pixel can be attained.

Next, a manufacturing method of the CMOS sensor (FIG. 6) according to the first embodiment is explained.

Figure 8A:
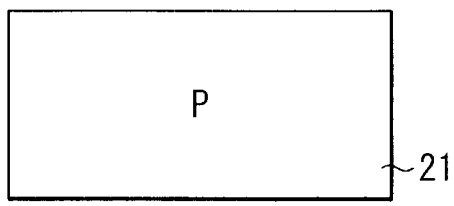
FIGS. 8A to 8H are cross sectional views showing the manufacturing process of a CMOS sensor of the first embodiment in a stepwise fashion.
Figure 8B:
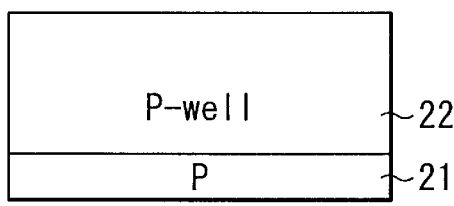

First, as shown in FIG. 8A, a p-type silicon substrate 21 is prepared. Then, as shown in FIG. 8B, a p-type well region (p-well) 22 is formed on one surface side of the substrate 21 by a method such as ion-implantation, thermal diffusion or the like.

Figure 8C:
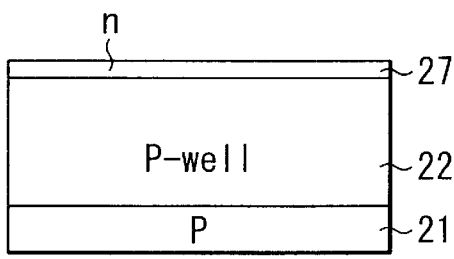

Next, as shown in FIG. 8C, an n-type diffused layer 27 is formed near the surface portion of the p-type well region 22 by a method such as ion-implantation or the like. The n-type diffused layer 27 is formed to serve the purpose of controlling the threshold voltage in the channel region.

Figure 8D:
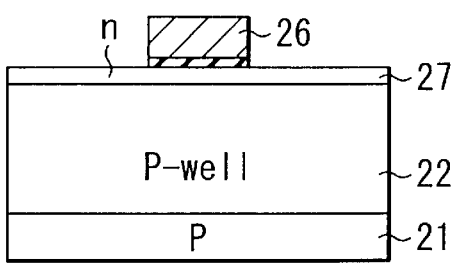

After this, as shown in FIG. 8D, after a gate insulating film is formed on the substrate surface by a method such as a thermal oxidation method, an electrode film formed of polysilicon, for example, is deposited on the resultant structure and then the electrode film and gate insulating film are selectively etched by a method such as a photolithography technology to form a gate electrode 26.

Figure 8E:
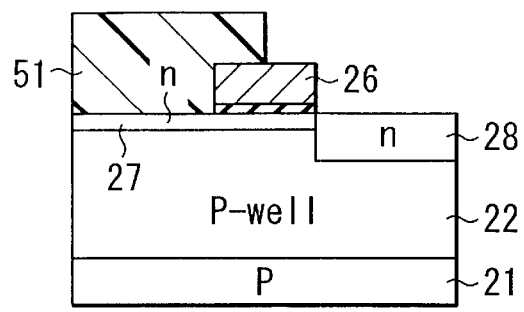

Next, as shown in FIG. 8E, an n-type diffused layer 28 is formed by ion-implanting n-type impurity in a self-alignment manner with respect to the gate electrode 26 with the photo-electric conversion region (25 in FIG. 4) masked with a resist 51. The n-type diffused layer 28 corresponds to a drain of a readout MOS transistor having the gate electrode 26 and is used as the signal detection portion. The n-type diffused layer 28 is so formed that the impurity concentration thereof can be set higher than that of the n-type diffused layer 27.

Figure 8F:
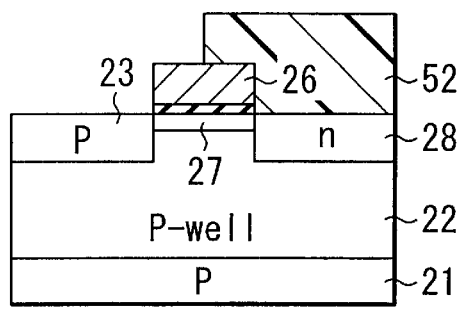

After this, as shown in FIG. 8F, a p-type diffused layer 23 is formed near the surface portion of the p-type well region 22 by ion-implanting p-type impurity in a self-alignment manner with respect to the gate electrode 26 with the n-type diffused layer 28 masked with a resist 52. The p-type diffused layer 23 is formed to serve the purpose of suppressing occurrence of a dark current which will occur in the substrate interface of an n-type diffused layer 24 acting as a signal accumulation portion formed in the later step. Further, the p-type diffused layer 23 is so formed that the impurity concentration thereof can be set higher than that of the n-type diffused layer 27.

Figure 8G:
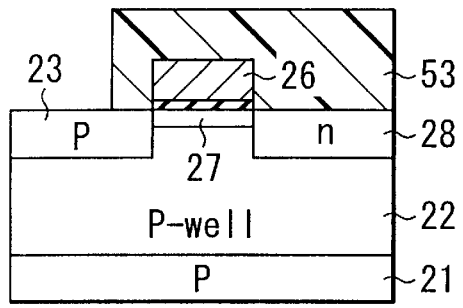
Figure 8H:
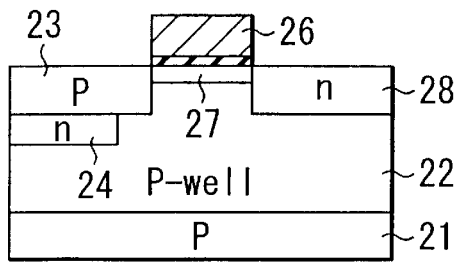

Then, n-type impurity is ion-implanted with a resist 53 used as a mask in a position separated by at least a distance Y (which is approximately 50 to 300 nm, for example, as described before) in the horizontal direction from the end portion of the gate electrode 26 on the photo-electric conversion region (25 in FIG. 4) side (FIG. 8G). Thus, an n-type diffused layer 24 used as a signal accumulation portion is formed as shown in FIG. 8H.

By the above process, a CMOS sensor as shown in FIG. 4 is manufactured. If it is desired to form the solid-state imaging device shown in FIG. 6, the n-type diffused layer 27 in FIG. 8B may be formed deeper. Further, if it is desired to form the solid-state imaging device shown in FIG. 7, the substrate 21 may be replaced by an n-type substrate.

As described above, the n-type diffused layer 24 used as the signal accumulation portion is formed by ion-implantation. If an attempt is made to form the n-type diffused layer 24 in a self-alignment manner with respect to the gate electrode 26, ion is implanted into not only the exposed substrate surface portion but also a portion which lies under the gate electrode 26.

When the n-type diffused layer 24 used as the signal accumulation portion is formed in a position which is deep from the substrate surface, the amount of energy for ion-implantation becomes large and ion reaches a portion of the silicon substrate which lies directly under the gate electrode 26. In this case, an n-type layer which is not originally intended to be formed is formed in a portion of the silicon substrate lying under the gate electrode 26.

Particularly, in the advanced CMOS process, the thickness of a gate electrode tends to be smaller. Therefore, the above problem becomes more serious in the future. However, the above problem does not occur by selectively forming the n-type diffused layer 24 used as the signal accumulation portion in a position separated by a preset distance Y from the end portion of the gate electrode by use of the photoresist 53 as in the present embodiment instead of forming the same in a self-alignment manner with respect to the gate electrode 26.

(Second Embodiment)

Figure 9:
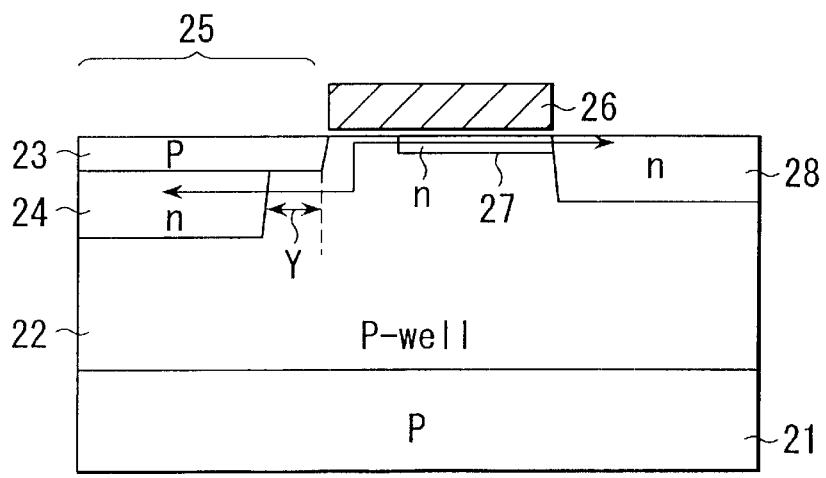
FIG. 9 is a cross sectional view showing the structure of an extracted portion of the unit pixel of a CMOS sensor according to a second embodiment.

FIG. 9 is a cross sectional view showing the structure of an extracted portion of the unit pixel of a CMOS sensor according to a second embodiment. Since the cross sectional structure of FIG. 9 corresponds to that of the first embodiment shown in FIG. 4, portions of FIG. 9 which correspond to those of the first embodiment shown in FIG. 4 are denoted by the same reference numerals, the explanation thereof is omitted and only portions different from those of FIG. 4 are explained.

Figure 10:
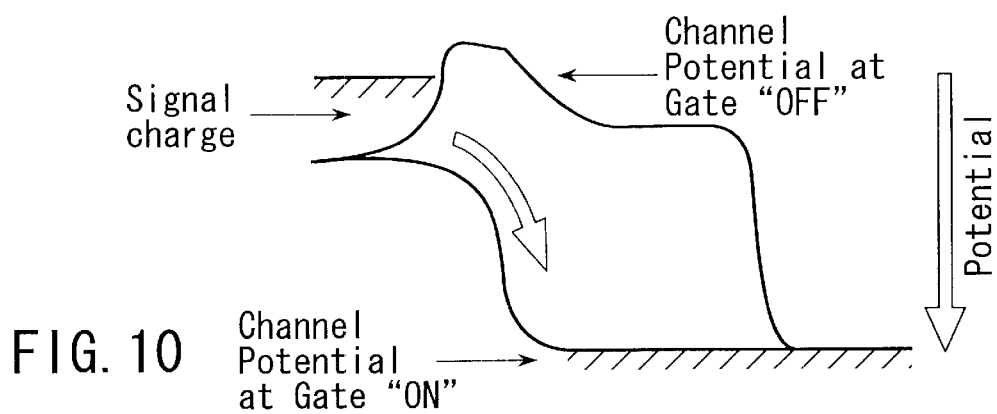
FIG. 10 is a diagram showing the potential profile of the unit pixel of FIG. 9.

In FIG. 4, the n-type diffused layer 27 for controlling the threshold voltage of the gate electrode 26 is formed over the entire portion of the channel region which lies on the surface portion of the well region 22 and lies below the gate electrode 26, but in the case of FIG. 9, the n-type diffused layer 27 is formed in a portion of the channel region except a portion thereof which lies on the photo-electric conversion region 25 side. FIG. 10 is a diagram showing the potential profile along the 10—10 line of FIG. 9.

Like the first embodiment, in the second embodiment, as shown in FIG. 10, the channel potential at the time when the ON voltage is applied to the gate electrode 26 is set higher than the potential of the signal accumulation portion (n-type diffused layer 24) so that the signal readout operation can be sufficiently effected. In the second embodiment, it is possible to further attain the effect that the channel potential of the region in which the n-type diffused layer 27 is not formed in the channel region becomes sufficiently lower than the potential of the signal accumulation portion (n-type diffused layer 24) when the gate electrode 26 is set in the OFF state, and therefore, the amount of signal charges which can be accumulated in the signal accumulation portion (n-type diffused layer 24) in the signal accumulation period can be increased.

Further, in the second embodiment, the potential of the channel region which lies below the gate electrode 26 is set to the same potential as that of the signal detection portion (n-type diffused layer 28) when the readout potential is supplied to the gate electrode 26 to set the gate electrode 26 into the ON state and the potential is set lower than that of the signal detection portion (n-type diffused layer 28) when the gate electrode 26 is set into the OFF state.

Figure 11A:
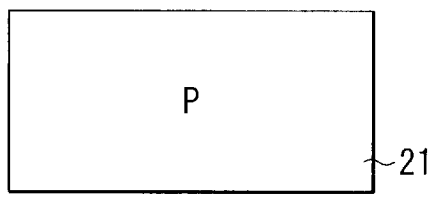
FIGS. 11A to 11H are cross sectional views showing the manufacturing process of a CMOS sensor of the second embodiment in a stepwise fashion.
Figure 11E:
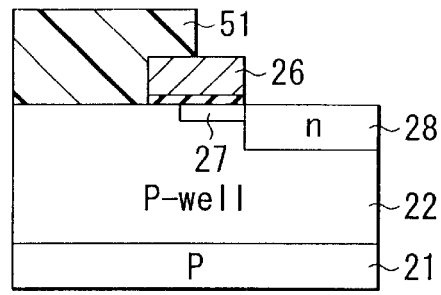
Figure 11B:
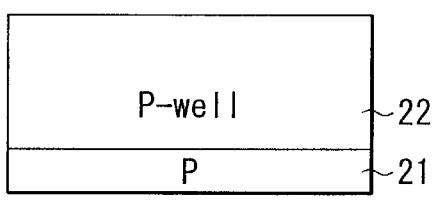
Figure 11F:
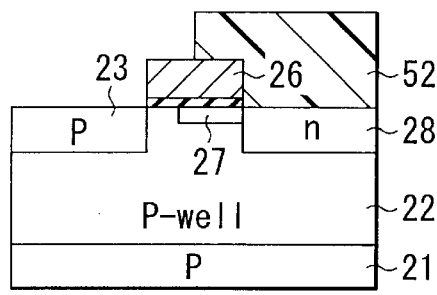
Figure 11C:
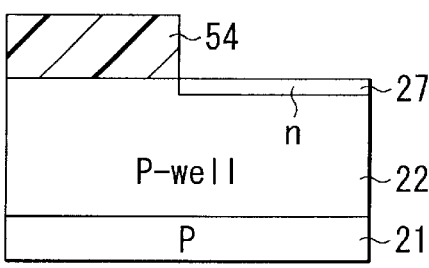
Figure 11G:
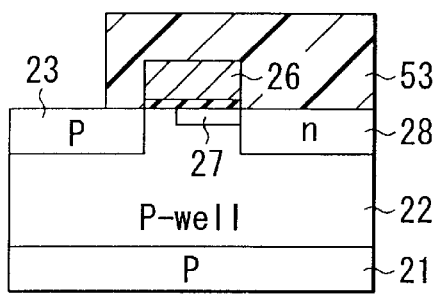

The manufacturing process of a CMOS sensor of the second embodiment is shown in FIGS. 11A to 11H. The steps shown in FIGS. 11A and 11B are effected in the same manner as in the steps shown in FIGS. 8A and 8B of the first embodiment. Then, as shown in FIG. 11C, after a resist 54 is formed on the supper surface of a p-type well 22, an n-type diffused layer 27 is selectively formed by ion-implantation.

Figure 11D:
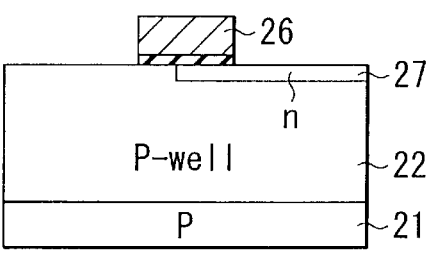
Figure 11H:
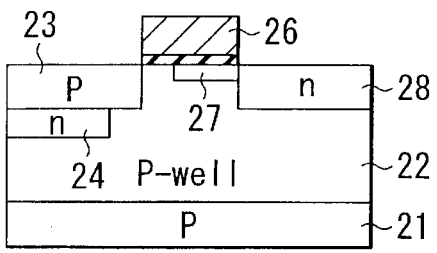

Next, as shown in FIG. 11D, a gate electrode 26 is formed above the p-type well 22 with a gate insulating film disposed therebetween. In this case, the gate electrode is formed so that one end portion of the gate electrode 26 will be offset from the end portion of the n-type diffused layer 27 by approximately 300 nm at maximum.

The steps of FIGS. 11E to 11H are effected in the same manner as in the steps of FIGS. 8E to 8H of the first embodiment. By the above process, the CMOS sensor of FIG. 9 is formed.

(Third Embodiment)

Figure 12:
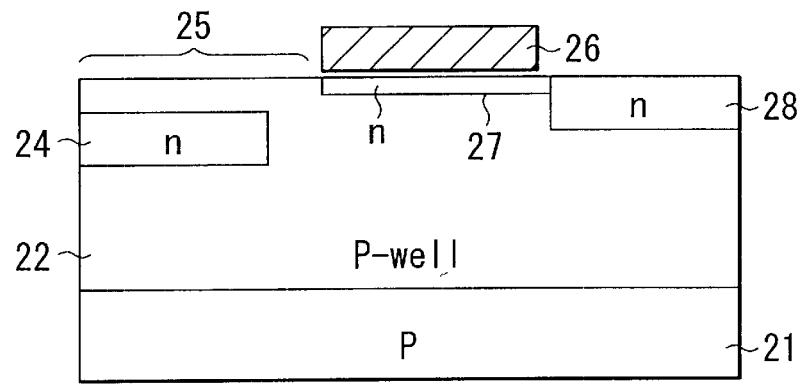
FIG. 12 is a cross sectional view showing the structure of an extracted portion of the unit pixel of a CMOS sensor according to a third embodiment.

FIG. 12 is a cross sectional view showing the structure of an extracted portion of the unit pixel of a CMOS sensor according to a third embodiment. Since the cross sectional structure of FIG. 12 is similar to that of the first embodiment shown in FIG. 4, portions of FIG. 12 which correspond to those of the first embodiment shown in FIG. 4 are denoted by the same reference numerals, the explanation thereof is omitted and only portions different from those of FIG. 4 are explained.

In FIG. 4, the p$^+$-type diffused layer 23 is formed on the signal accumulation portion (n-type diffused layer 24) of the photo-electric conversion region 25 to serve the purpose of preventing occurrence of a dark current, but in the case of FIG. 12, a modification is made so as to make it possible to omit the p$^+$-type diffused layer 23. That is, if the impurity concentration of the p-type diffused layer 22 is sufficiently high, formation of the p$^+$-type diffused layer 23 can be omitted.

Also, in the third embodiment, the potential of the channel region which lies below the gate electrode 26 is set to the same potential as that of the signal detection portion (n-type diffused layer 28) when the readout potential is supplied to the gate electrode 26 to set the gate electrode 26 into the ON state and the potential is set lower than that of the signal detection portion (n-type diffused layer 28) when the gate electrode 26 is set into the OFF state.

Figure 13A:
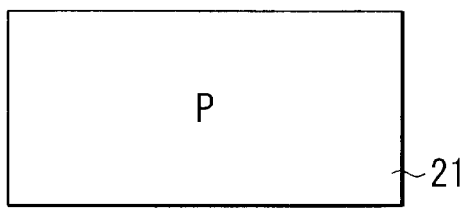
FIGS. 13A to 13G are cross sectional views showing the manufacturing process of a CMOS sensor of the third embodiment in a stepwise fashion.
Figure 13B:
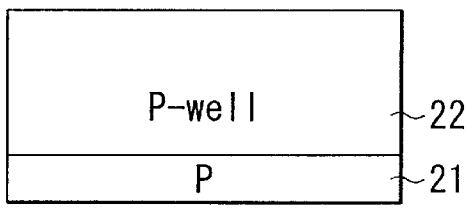
Figure 13C:
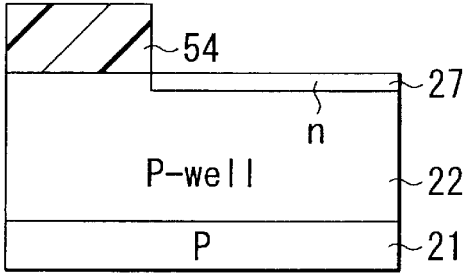
Figure 13D:
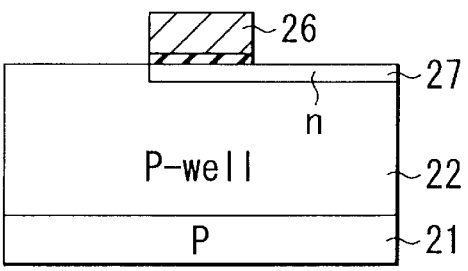
Figure 13E:
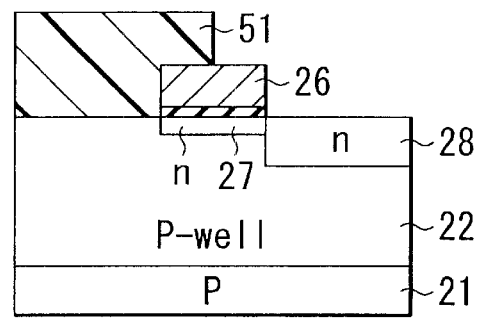
Figure 13F:
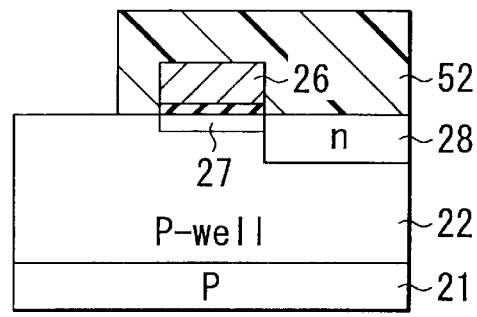
Figure 13G:
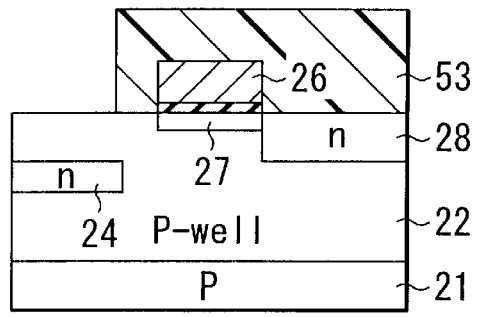

The manufacturing process of a CMOS sensor of the third embodiment is shown in FIGS. 13A to 13G. The steps shown in FIGS. 13A to 13C are effected in the same manner as in the steps shown in FIGS. 11A to 11C of the second embodiment. Then, as shown in FIG. 13D, a gate electrode 26 is formed over the p-type well 22 with a gate insulating film disposed therebetween so that the end portion of the n-type diffused layer 27 will substantially coincide with the end portion of the gate electrode 26. The steps of FIGS. 13E and 13F are effected in the same manner as in the steps of FIGS. 11E and 11F of the second embodiment. Next, as shown in FIG. 13G, a resist 53 is formed and an n-type diffused layer 24 is formed in a portion of the p-type well 22 which is separated by a preset distance in the horizontal direction from the end of the gate electrode 26.

(Fourth Embodiment)

Figure 14:
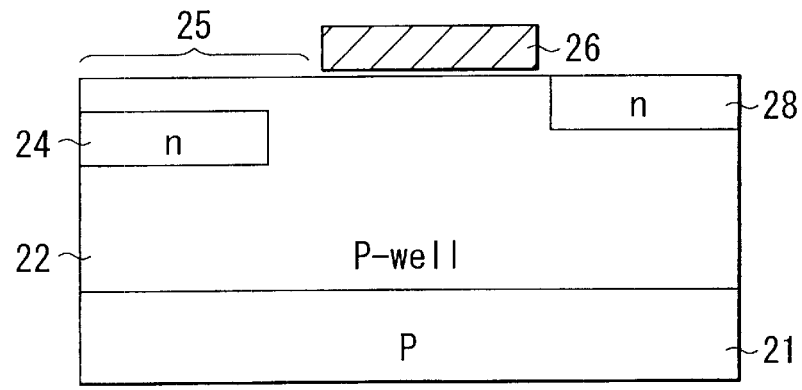
FIG. 14 is a cross sectional view showing the structure of an extracted portion of the unit pixel of a CMOS sensor according to a fourth embodiment.

FIG. 14 is a cross sectional view showing the structure of an extracted portion of the unit pixel of a CMOS sensor according to a fourth embodiment. Since the cross sectional structure of FIG. 14 is similar to that of the third embodiment shown in FIG. 12, portions of FIG. 14 which correspond to those of the third embodiment shown in FIG. 12 are denoted by the same reference numerals, the explanation thereof is omitted and only portions different from those of FIG. 12 are explained.

In FIG. 12, the n-type diffused layer 27 used for controlling the threshold voltage of the gate electrode 26 is formed in the channel region which lies on the surface portion of the p-type well region 22 and lies below the gate electrode 26, but in the case of FIG. 14, a modification is made to omit formation of the n-type diffused layer 27.

With the above structure, the channel potential can be set lower than that of the signal accumulation portion (n-type diffused layer 24) at the time when the gate electrode 26 is set in the OFF state and the channel potential can be set higher than that of the signal accumulation portion (n-type diffused layer 24) when the gate electrode 26 is set in the ON state, depending on the relation of the impurity concentrations among the p-type silicon substrate 21, p-type well region 22, the impurity concentration of the signal accumulation portion (n-type diffused layer 24) and the impurity concentration of the signal detection portion (n-type diffused layer 28).

Also, in the fourth embodiment, the potential of the channel region which lies below the gate electrode 26 is set to the same potential as that of the signal detection portion (n-type diffused layer 28) when the readout potential is supplied to the gate electrode 26 to set the gate electrode 26 into the ON state and the potential is set lower than that of the signal detection portion (n-type diffused layer 28) when the gate electrode 26 is set into the OFF state.

Since the manufacturing process of a CMOS sensor of the fourth embodiment is similar to the manufacturing process of the third embodiment (FIGS. 13A to 13G) except that the step of forming the n-type diffused layer 27 is omitted, the explanation thereof is omitted.

In each of the above embodiments, a case wherein the first conductivity type is set to a p-type, the second conductivity type is set to an n-type, and the p-type well region 22 is formed on the p-type silicon substrate 21 is explained. It is possible to omit formation of the p-type well region 22 when the p-type silicon substrate is used and form the photoelectric conversion region, signal detection portion and the like on the p-type silicon substrate.

Further, in each of the above embodiments, a case wherein the p-type silicon substrate 21 is of p-type, the well region 22 formed thereon is of p-type and the signal accumulation portion (source) and the drain are formed of n-type diffused layers is explained, but it is possible to use an n-type substrate as the silicon substrate, form an n-type well region thereon and form a signal accumulation portion (source) and a drain which are formed of p-type diffused layers on the surface portion of the n-type well region. In this case, instead of the p+-type diffused layer 23 which is formed to prevent occurrence of a dark current, an n-type diffused layer is formed on the signal accumulation portion. Thus, the p-type and n-type can be replaced in each of the above embodiments.

As described above, according to this invention, a solid-state imaging device can be provided which can permit the operation for reading the signal charge from the signal accumulation portion to be easily effected and prevent thermal noise at the dark time, dark current noise, image-lag and the like from occurring even when the readout potential supplied to the readout gate electrode is lowered as the unit pixel is miniaturized and if the impurity concentration of the well region which lies below the gate electrode and in which the channel region is formed is increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:

a semiconductor substrate including a surface region of a second conductivity type; and a plurality of unit pixels arranged in a matrix form on the surface region of the second conductivity type, the plurality of unit pixels forming an imaging area and each of the plurality of unit pixels including
   a first semiconductor region of a first conductivity type formed in a position separated by a preset distance from a surface of the surface region in a depth direction of the surface region and accumulates signal charges obtained by photo-electrical conversion of input light,
   a gate electrode formed adjacent to the first semiconductor region above the surface region and controls readout of the signal charges accumulated in said first semiconductor region, end portions of the gate electrode and the first semiconductor region which substantially face each other being formed in positions separated by a preset distance in a horizontal direction, and
   a second semiconductor region of the first conductivity type formed in a channel region lying on the surface region and below the gate electrode and controls a threshold voltage of the gate electrode,
   wherein the second semiconductor region is formed in a portion of the channel region lying below the gate electrode except a partial region thereof which lies on a side of the first semiconductor region.

2. A solid-state imaging device comprising:

a semiconductor substrate including a surface region of a second conductivity type; and a plurality of unit pixels arranged in a matrix form on the surface region of the second conductivity type, the plurality of unit pixels forming an imaging area and each of the plurality of unit pixels including
   a first semiconductor region of a first conductivity type formed in a position separated by a preset distance from a surface of the surface region in a depth direction of the surface region and accumulates signal charges obtained by photo-electrical conversion of input light,
   a gate electrode formed adjacent to the first semiconductor region above the surface region and controls readout of the signal charges accumulated in said first semiconductor region, end portions of the gate electrode and the first semiconductor region which substantially face each other being formed in positions separated by a preset distance in a horizontal direction,
   a second semiconductor region of the first conductivity type formed in a channel region lying on the surface region and below the gate electrode and controls a threshold voltage of the gate electrode, and
   a third semiconductor region of the second conductivity type formed on the surface region above the first semiconductor region and an impurity concentration of which is higher than that of the channel region lying below the gate electrode,
   wherein the second semiconductor region is continuously formed from substantially an entire portion of the channel region lying below the gate electrode to a portion under the third semiconductor region and formed in contact with the first semiconductor region.

3. A solid-state imaging device comprising:
a semiconductor substrate including a surface region of a second conductivity type; and
a plurality of unit pixels arranged in a matrix form on the surface region of the second conductivity type, the plurality of unit pixels forming an imaging area and each of the plurality of unit pixels including a first semiconductor region of a first conductivity type which is formed in a position separated by a preset distance from a surface of the surface region in a depth direction of the surface region and accumulates signal charges obtained by photo-electrical conversion of input light, a gate electrode which is formed adjacent to the first semiconductor region above the surface region and controls readout of the signal charges accumulated in the first semiconductor region, end portions of the gate electrode and the first semiconductor region which substantially face each other being formed in positions separated by a preset distance in a horizontal direction, and a second semiconductor region of the first conductivity type which is formed in a channel region lying on an upper surface of the surface region and below the gate electrode and controls a threshold voltage of the gate electrode, the second semiconductor region being formed in a position separated from the first semiconductor region with the surface region disposed between the first and the second semiconductor region.

4. The solid-state imaging device according to claim 3, wherein the second semiconductor region is formed in substantially an entire portion of the channel region lying below the gate electrode.

5. The solid-state imaging device according to claim 3, wherein the second semiconductor region is formed in a portion of the channel region lying below the gate electrode except a partial region thereof which lies on a side of the first semiconductor region.

6. The solid-state imaging device according to claim 3, wherein further comprising a third semiconductor region of the second conductivity type which is formed on the surface region above the first semiconductor region and an impurity concentration of which is higher than that of the channel region lying below the gate electrode.

7. The solid-state imaging device according to claim 6, wherein the second semiconductor region is continuously formed from substantially an entire portion of the channel region lying below the gate electrode to a portion under the third semiconductor region and formed in contact with the first semiconductor region.

8. The solid-state imaging device according to claim 3, wherein the semiconductor substrate is of the first conductivity type.

9. A solid-state imaging device comprising:
a semiconductor substrate including a surface region of a second conductivity type;
a plurality of unit pixels arranged in a matrix form on the surface region, the plurality of unit pixels forming an imaging area and each of the plurality of unit pixels including
a first semiconductor region of a first conductivity type formed in a position separated by a preset distance from a surface of the surface region in a depth direction of the surface region and accumulates signal charges obtained by photo-electrical conversion of input light,
a gate electrode formed adjacent to the first semiconductor region above the surface region and controls readout of the signal charges accumulated in the first semiconductor region,
a fourth semiconductor region of the first conductivity type formed adjacent to the gate electrode and detects the signal charges read out by the gate electrode and transferred via a channel region below the gate electrode, a potential of the channel region below the gate electrode being set to the same potential as that of said first semiconductor region when a readout potential is supplied to the gate electrode to set the gate electrode into an ON state and the potential of the channel region is set lower than that of the fourth semiconductor region when the gate electrode is set in an OFF state, and
a second semiconductor region of the first conductivity type formed in the channel region lying below the gate electrode and controls a threshold voltage of the channel region,
wherein the second semiconductor region is formed in a portion of the channel region lying below the gate electrode except a partial region thereof which lies on a side of the first semiconductor region.

10. A solid-state imaging device comprising:
a semiconductor substrate including a surface region of a second conductivity type;
a plurality of unit pixels arranged in a matrix form on the surface region, the plurality of unit pixels forming an imaging area and each of the plurality of unit pixels including
a first semiconductor region of a first conductivity type formed in a position separated by a preset distance from a surface of the surface region in a depth direction of the surface region and accumulates signal charges obtained by photo-electrical conversion of input light,
a gate electrode formed adjacent to the first semiconductor region above the surface region and controls readout of the signal charges accumulated in the first semiconductor region,
a fourth semiconductor region of the first conductivity type formed adjacent to the gate electrode and detects the signal charges read out by the gate electrode and transferred via a channel region below the gate electrode, a potential of the channel region below the gate electrode being set to the same potential as that of said first semiconductor region when a readout potential is supplied to the gate electrode to set the gate electrode into an ON state and the potential of the channel region is set lower than that of the fourth semiconductor region when the gate electrode is set in an OFF state,
a second semiconductor region of the first conductivity type formed in the channel region lying below the gate electrode and controls a threshold voltage of the channel region, and
a third semiconductor region of the second conductivity type formed on the surface region above the first semiconductor region and an impurity concentration of which is higher than that of the channel region lying below the gate electrode,
wherein the second semiconductor region is continuously formed from substantially an entire portion of the channel region lying below the gate electrode to a portion under the third semiconductor region and formed in contact with the first semiconductor region.

* * * * *